United States Patent [19]
Kim et al.

[11] Patent Number: 5,621,349
[45] Date of Patent: Apr. 15, 1997

[54] DEVICE FOR CONTROLLING AN OUTPUT LEVEL OF AN FM DETECTING CIRCUIT USING PHASE LOCKED LOOP

[75] Inventors: Yang-gyun Kim, Seoul; Jeong-in Lee, Kyonggi-do, both of Rep. of Korea

[73] Assignee: Samsung Electronics Co., Ltd, Suwon, Rep. of Korea

[21] Appl. No.: 633,186

[22] Filed: Apr. 16, 1996

[30] Foreign Application Priority Data

Jul. 3, 1995 [KR]  Rep. of Korea .................. 95-19293

[51] Int. Cl.$^6$ ............................ H03D 3/00; H03L 7/08
[52] U.S. Cl. ........................ 329/325; 329/318; 331/23; 455/214; 455/245.1; 455/337
[58] Field of Search .................... 329/325, 318, 329/326, 321; 331/17, 23; 455/214, 205, 245.1, 245.2, 337, 208, 340, 341

[56] References Cited

U.S. PATENT DOCUMENTS

| | | | |
|---|---|---|---|
| 4,096,360 | 6/1978 | Takahashi et al. | 329/326 X |
| 4,107,624 | 8/1978 | Turner | 329/326 X |
| 4,463,317 | 7/1984 | Kusakabe | 455/214 X |
| 4,479,091 | 10/1984 | Yoshisato | 329/326 |

*Primary Examiner*—David Mis
*Attorney, Agent, or Firm*—Cushman Darby & Cushman IP Group of Pillsbury Madison & Sutro LLP

[57] ABSTRACT

An FM detecting circuit using phase locked loop (PLL) is disclosed. A reference voltage unit generates a reference voltage. A phase detector detects a phase difference between an FM signal and another frequency signal. A low-pass filter receives the output signal from the phase detector, and outputs a detected signal by passing only low frequency signals. A DC component detector receives the output signal from the low-pass filter, and detects a DC component. A voltage controlled amplifier receives the reference voltage and the voltage output from the DC component detector, and outputs a constant level voltage by controlling a gain based upon the difference between the two received voltages.

7 Claims, 1 Drawing Sheet

DEVICE FOR CONTROLLING AN OUTPUT LEVEL OF AN FM DETECTING CIRCUIT USING PHASE LOCKED LOOP

BACKGROUND OF THE INVENTION

1. Field of the Invention

The present invention relates in general to an improved FM detecting circuit which uses a phase locked loop (PLL) mode.

2. Description of the Related Art

In general, an FM detecting circuit which uses a PLL mode forms a closed feedback circuit. The closed feedback circuit comprises a phase detector, a low-pass filter, an amplifier and a voltage controlled oscillator.

This circuit is constructed in such a manner that the frequency and phase of input signals are compared by the phase detector, a voltage is generated proportional to an error obtained from the comparison, and then the error voltage is amplified by an amplifier after passing through a low-pass filter. Subsequently, the amplified error voltage is applied to a voltage controlled oscillator which varies the applied voltage frequency to decrease the oscillating frequency and the phase difference of the voltage controlled oscillator The PLL circuit has been employed to control different circuits including servo motor circuits, FM tuners and local oscillators, each being highly stable over varying frequencies.

A conventional FM detecting circuit 100 which uses a PLL mode will now be described with reference to FIG. 1. A reference voltage unit 1 is provided for applying a reference voltage. A phase detector 2 senses a phase difference between a frequency-modulated signal and a frequency signal. A low-pass filter 3 receives the output signal from phase detector 2, and outputs a detecting signal after passing only low frequency signals therethrough. A voltage controlled oscillator 4 receives the output signal from the low-pass filter 3, and modifies the frequency signal.

Providing that power is applied by a user, phase detector 2 receives an FM signal and an input signal from the voltage controlled oscillator, compares the phases of two signals, and then generates a DC voltage proportional to a phase difference.

Subsequently, the low-pass filter 3 receives a reference voltage from the reference voltage unit 1 and the DC voltage from the phase detector 2, and outputs a detected signal by passing the low frequency signals therethrough.

Next, voltage controlled oscillator 4 receives the output signal from the low-pass filter 3, and generates the oscillating signal to be inputted to phase detector 2.

In such a feedback circuit, the detected signal level is determined based upon the gain of voltage controlled oscillator 4. In general, the gain of voltage controlled oscillator 4 is in inverse proportion to the detected signal level. That is, under the condition that the carrier frequency and the modulation degree are constant, the detected signal level is lowered when the gain of the voltage controlled oscillator 4 is raised, and the level is raised when the gain is lowered.

It is difficult to control the level of the detected signal when employing the illustrated conventional FM detecting circuit in an integrated circuit, because values of a resistance and a capacitor of the voltage controlled oscillator may be varied as a result of production tolerance variations.

More specifically, if a free running frequency of the voltage controlled oscillator falls below a predetermined frequency under the influence of the resistance and the capacitor of the voltage controlled oscillator with the procedure tolerance, the gain of the voltage controlled oscillator will be lower than a predetermined gain, and the detected signal level will be raised above an average level. If a free running frequency of the voltage controlled oscillator exceeds a predetermined frequency, the gain of the voltage controlled oscillator will be higher than the predetermined gain, while the detected signal level will be below the average level.

Accordingly, it is difficult for the illustrated conventional FM detecting circuit using a PLL mode to produce an output signal having an accurate level.

SUMMARY OF THE INVENTION

An object of the present invention is to solve the above-mentioned problems associated with the illustrated conventional circuit.

Another object is to provide an FM detecting circuit using a phase locked loop (PLL) mode, capable of outputting signals having a constant voltage level at any time, independent of the values of a resistance and a capacitor of the voltage controlled oscillator with the procedure tolerance, by adjusting the output signal level after sensing a change in the output signal level.

Therefore, in order to achieve at least the above objects, according to one embodiment of the present invention, an FM detecting circuit using a PLL mode is provided which controls its output level. The FM detecting circuit comprises a reference voltage unit, a phase detector, a low-pass filter, a voltage controlled oscillator, a DC component detector, and a voltage controlled amplifier. The reference voltage unit applies a reference voltage. The phase detector senses a phase difference between a frequency-modulated signal and a frequency signal, and outputs a signal upon detecting the phase difference. The low-pass filter receives the output signal from the phase detector, and outputs a detected signal by passing only low frequency signals therethrough. The voltage controlled oscillator receives the output signal from the low-pass filter, and outputs an oscillating signal. The DC component detector receives the output signal from the low-pass filter, and detects a DC component. The voltage controlled amplifier receives the reference voltage and the output voltage from the DC component detector, and outputs a constant voltage level by controlling a gain upon a difference of two voltages.

DETAILED DESCRIPTION OF THE PREFERRED EMBODIMENTS

Figure 1:
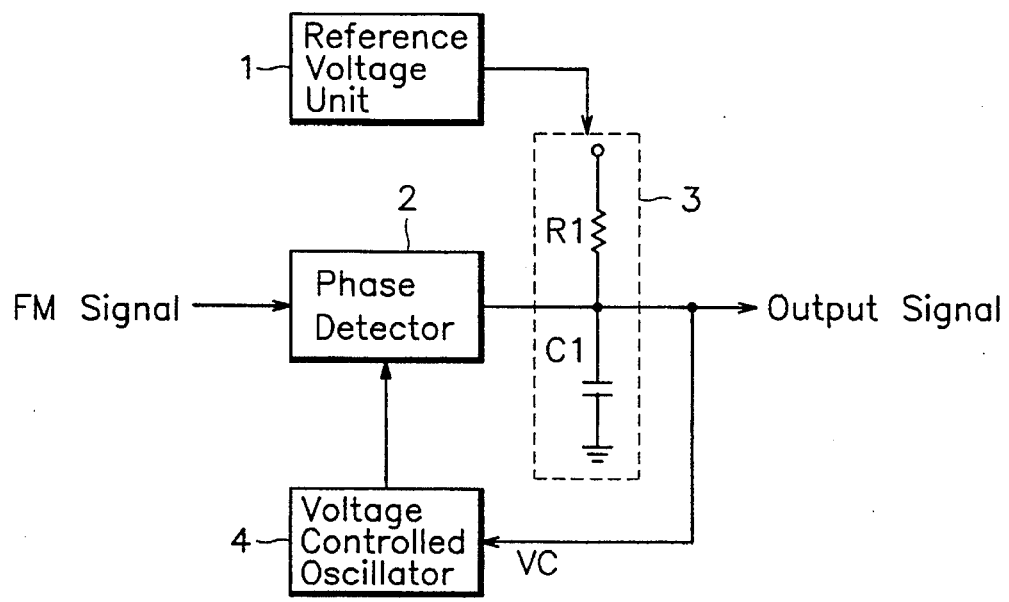
FIG. 1 is a block diagram of a conventional FM detecting circuit using a phase locked loop (PLL) mode.
Figure 2:
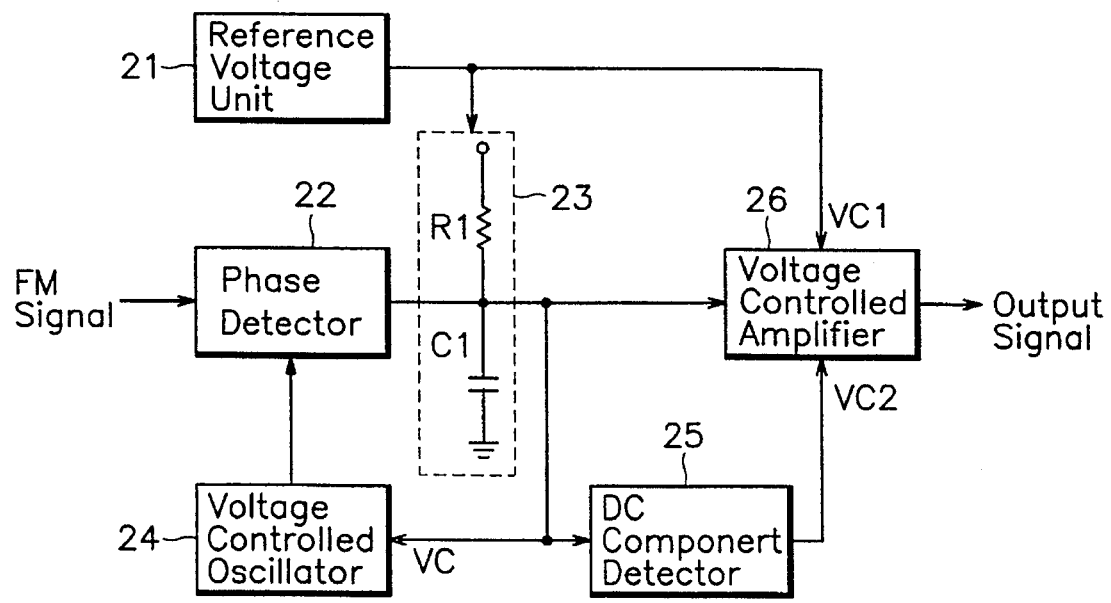
FIG. 2 is a block diagram of an exemplary embodiment of an FM detecting circuit using a phase locked loop (PLL) mode.

Referring now to FIG. 2, an exemplary embodiment of the present invention will be described.

As shown in FIG. 2, an FM detecting circuit 110 using a phase locked loop (PLL) mode is provided which includes a device for controlling its output level. A reference voltage unit 21 generates a reference voltage VC1. In order to decide free running frequency of voltage controlled oscillator 24 of a phase locked loop, the reference voltage unit 21 always outputs regular direct current voltage VC1 into a voltage controlled amplifier 26. A phase detector 22 senses a phase difference between an FM signal and another frequency signal, and outputs a signal upon detecting the phase difference. A low-pass filter 23 receives the output signals from the reference voltage unit 21 and the phase detector 22, and removes a carrier component from the input signals by only passing low frequency signals therethrough. A voltage controlled oscillator 24 receives the output signal from the low-pass filter 23, and outputs an oscillating signal. A DC component detector 25 receives the output signal from the low-pass filter 23, and detects a DC component.

A voltage controlled amplifier 26 receives the reference voltage VC1 and the output voltage VC2 from the DC component detector 25, and outputs a constant level voltage by controlling its gain based upon a difference between two voltages.

Once power is applied by a user, the illustrated FM detecting circuit begins operating. At this time, the device is under a free running condition, and voltage controlled oscillator 24 oscillates at a free running frequency determined by the reference voltage VC1 from the reference voltage unit 21. Further, the gain of the voltage controlled amplifier 26 is "1" because the output voltage VC2 from the DC component detector 25 is equal to the reference voltage VC1 from the reference voltage unit 21.

When the FM signal is inputted to the phase detector 22, the circuit is under the locked state and the phase detector 22 detects the carrier frequency from the FM signal.

When the free running frequency of the voltage controlled oscillator 24 falls below a predetermined frequency, the resistance and the capacitor of the voltage controlled oscillator 24 having an allowable deviation from the standard, the voltage VC of the voltage controlled oscillator 24 should be higher than the applied reference voltage VC1 in order to detect the carrier frequency.

When the free running frequency is lowered, the gain of the voltage controlled oscillator 24 is also lowered, while the output voltage VC of the low-pass filter 23 becomes higher than a predetermined voltage.

On the other hand, the output voltage VC from low-pass filter 23 is inputted to voltage controlled amplifier 26 through DC component detector 25 which detects the DC frequency. At this time, the voltage difference between VC1 and VC2 is determined by voltage controlled amplifier 26 to be a negative value because the output voltage VC2 from the DC component detector 25 is higher than the reference voltage VC1 from reference voltage unit 21. Accordingly, the voltage controlled amplifier 26 reduces the gain of the voltage input thereto, and the resultant output signal is outputted after multiplying the gain by the signal input from the low-pass filter 23. So in this way, the output voltage VC from the low-pass filter 23 which is higher than the predetermined voltage is lowered to a value equal to the predetermined voltage.

When the free running frequency of the voltage controlled oscillator 24 exceeds the predetermined frequency, the resistance and the capacitor of the voltage controlled oscillator 24 having an allowable deviation from the standard, the voltage VC of the voltage controlled oscillator 24 should be lower than the applied reference voltage VC1 in order to detect the carrier frequency.

When the free running frequency is raised, the gain of the voltage controlled oscillator 24 is also raised, while the output voltage VC of the low-pass filter 23 is lowered to a value below the predetermined voltage.

The DC component of the output voltage VC of the low-pass filter 23 is inputted to the voltage controlled amplifier 26 through the DC component detector 26.

At that time, the voltage difference between VC1 and VC2 is determined by voltage controlled amplifier 26 to be a positive value, because the output voltage VC2 from DC component detector 25 is lower than the reference voltage VC1 from reference voltage unit 21. Accordingly, voltage controlled amplifier 26 increases its gain. In this way, the voltage VC output from the low-pass filter 23, which is lower than the predetermined voltage, is increased to become equal to the predetermined voltage.

In this circuit, voltage controlled amplifier 26 controls its gain based upon the voltages VC1 and VC2 from the reference voltage unit 21 and the DC component detector 25. More particularly, the gain of voltage controlled amplifier 26 is proportional to the magnitude of voltage variation from VC1 to VC2, but is otherwise "1" when the magnitude of voltage variation is "0". The amount of gain of voltage controlled amplifier 26 is increased proportional to the voltage difference between the reference voltage VC1 and the output voltage VC2 of the DC component detector 25 when the reference voltage VC1 is higher than the output voltage VC2 of the DC component detector 25, while the gain is decreased proportional to the voltage difference between the reference voltage VC1 and the output voltage VC2 of the DC component detector 25 when the reference voltage VC1 is lower than the output voltage VC2 of the DC component detector 25.

It is preferable that the gain of the voltage controlled amplifier 26 vary in such a manner that it is equal to the magnitude of voltage variation resulting from the resistance and the capacitor of the voltage controlled oscillator 24 having an allowable deviation from the standard. For example, if the allowable deviation causes the voltage to vary by up to a maximum of 40 percent, the gain of the voltage controlled oscillator 24 is increased by up to 40 percent with respect to the normal gain when the voltage difference between VC1 and VC2 is positive, while it is decreased by up to 40 percent when the voltage difference is negative.

Accordingly, voltage controlled amplifier 26 outputs a constant level by compensating voltage variances caused by the procedure tolerance of the resistance and the capacitor of the voltage controlled oscillator 24. Consequently, an improved FM detecting circuit using PLL has been provided which controls its output to accurately maintain a constant voltage level, by sensing voltage variations caused by deviations in the resistance and the capacitance of a voltage controlled oscillator 24 from a standard, and controlling the gain of the voltage controlled amplifier 26 accordingly.

While the present invention has been described with respect to specific means, structure, and steps in connection with a particular exemplary embodiment, changes can be made to the particulars disclosed without departing from the invention, to extend to equivalent means, structure, and steps, such as are within the scope of the appended claims.

What is claimed is:

1. An FM detecting circuit using a phase locked loop, said circuit comprising:

a reference voltage unit for generating a reference voltage;

a phase detector for sensing a phase difference between a frequency-modulated signal and a signal from voltage controlled oscillator and generates an error signal;

a low-pass filter which receives said error signal and filters high frequency signals therefrom to obtain a filtered signal;

a DC component detector for obtaining a DC component voltage from said filtered signal; and a voltage controlled amplifier which receives said reference voltage, said DC component voltage and said filtered signal and amplifies said filtered signal, controlling a gain of said filtered signal based upon a difference between said reference voltage and said DC component voltage.

2. The circuit according to claim 1, wherein said DC component detector includes another low-pass filter.

3. The circuit according to claim 1, wherein said voltage controlled amplifier comprises means for setting said gain to a value proportional to the amount of said difference between said reference voltage and DC component voltage, said gain being set to unity when said difference is zero.

4. The circuit according to claim 2, wherein said voltage controlled amplifier comprises means for setting said gain to a value proportional to the amount of said difference between said reference voltage and DC component voltage, said gain being set to unity when said difference is zero.

5. The circuit according to claim 1, wherein said gain is controlled to increase a signal level input to said voltage controlled amplifier by an amount proportional to said difference when said reference voltage is larger than said DC component voltage, and to decrease a signal level input to said voltage controlled amplifier by an amount proportional to said difference when said reference voltage is smaller than said DC component voltage.

6. An FM detecting circuit using a phase-locked loop, said circuit comprising:

a phase detector for comparing a phase of an input FM signal to a reference signal and generating an error signal;

a low-pass filter for filtering said error signal and producing an output signal;

an oscillator having an input which receives output signal and generates said reference signal based upon said output signal;

a variable controlled amplifier for receiving and amplifying said output signal to obtain a gain compensated output signal, said variable controlled amplifier controlling a gain applied to said output signal as a function of a level of a DC component of the output of said low-pass filter.

7. The circuit according to claim 6, wherein said gain increases when the level of said DC component decreases, and said gain decreases when the level of said DC component increases.

* * * * *